United States Patent [19]

Arikado et al.

[11] Patent Number: 4,878,995
[45] Date of Patent: Nov. 7, 1989

[54] METHOD OF DRY ETCHING AND APPARATUS FOR USE IN SUCH METHOD

[75] Inventors: Tsunetoshi Arikado, Tokyo; Makoto Sekine, Kanagawa; Haruo Okano; Yasuhiro Horiike, both of Tokyo, all of Japan

[73] Assignee: Kabushiki Kaisha Toshiba, Kanagawa, Japan

[21] Appl. No.: 214,368

[22] Filed: Jul. 1, 1988

[30] Foreign Application Priority Data

Jul. 2, 1987 [JP] Japan .................. 62-165860

[51] Int. Cl.$^4$ .................. H01L 21/306; B44C 1/22; C03C 15/00; C03C 25/06
[52] U.S. Cl. .................. 156/643; 156/646; 156/653; 156/657; 156/659.1; 156/662; 156/345; 204/192.37; 204/298
[58] Field of Search ............... 156/643, 646, 653, 657, 156/659.1, 662, 345, 656; 204/192.32, 192.35, 192.37, 298; 118/728, 50.1, 620, 623; 427/38, 39

[56] References Cited

U.S. PATENT DOCUMENTS

| 4,654,114 | 3/1987 | Kadomura | 156/643 |
| 4,717,447 | 12/1988 | Dieleman et al. | 156/643 |
| 4,786,361 | 11/1988 | Sekine et al. | 156/662 X |
| 4,789,426 | 12/1988 | Pipkin | 156/643 |

FOREIGN PATENT DOCUMENTS

62-61238 1/1987 Japan .

OTHER PUBLICATIONS

Applied Physics Letter, vol. 49, No. 24.9.163; A. Bensaoula et al.; Dec. 1986.

Primary Examiner—William A. Powell
Attorney, Agent, or Firm—Finnegan, Henderson, Farabow, Garrett, & Dunner

[57] ABSTRACT

This invention provides a method of dry etching and an apparatus for use with such method capable of producing a multi-layered structure having substantially a vertical wall and high selectivity. There is provided a method of the dry etching that disposing an object having a first film and second film thereon in a vacuum chamber, introducing an activated reactive gas, and cooling the object in the temperature or less being deposited a film including at least the first film material on the first film.

34 Claims, 10 Drawing Sheets

METHOD OF DRY ETCHING AND APPARATUS FOR USE IN SUCH METHOD

BACKGROUND OF THE INVENTION

This invention is relates to method of the dry etching and an apparatus for use in such method. More particularly, the invention relates to method of selective dry etching for multi-layered structures.

In recent years, the degree of integration of semiconductor integrated circuits has advanced, and circuit pattern sizes also have become finer. Thicknesses of various thin films utilized in the fabrication processes for semiconductor integrated circuits have become very small with the reduction in size of the circuit patterns. For instance, the thickness of a gate oxide film of a MOS type integrated circuit presently may be as small as 100 Å.

The reactive ion etching process is well known as one method of etching electrode materials formed of polycrystalline silicon, etc. The reactive ion etching process ordinarily includes the following steps. An object to be etched is disposed between a pair of parallel plate electrodes provided in a vacuum chamber and a reactive gas is introduced therein. Thereafter, the reactive gas is caused to discharge by applying radio frequency power. As a result, gas plasma generates from the discharge of the reactive gas. The object is etched by the gas plasma.

Plasma etching, ECR type dry etching, ion beam etching and photo excited etching, etc., in addition to reactive ion etching, are known methods for etching. These etching processes are also performed by operating chemically or physically on the object with ion of activated reactive gas.

Reactive ion etching is largely classified into two types. One is the cathode coupled type in which the object is disposed on the electrode applied with the radio frequency power. The other method is the anode coupled type in which the object to be etched is disposed on a grounded electrode. The electrode with object thereon is usually water-cooled to a normal temperature to prevent thermal degradation of a photo-resist formed on the surface of the object. The object is chucked electrostatically or mechanically, or merely placed on the water-cooled electrode.

In all the above-mentioned radio frequency coupled types, there is an ion assisted chemical reaction to carry out the etching. Ions existing in the plasma bombard the object and the chemical reaction carries out the etching naturally using an active radical of the reactive gas. The ion assisted chemical reaction is the most suitable for anisotropic etching, and the chemical reaction is the most suitable for isotropic etching. The etching direction is more satisfactory and the shape of the etched wall is closer to the vertical, the more the contribution of the ion assisted chemical reaction.

When the adhesion between the object and object holder is strong, this is sufficient to water-cool the object holder to the normal temperature and prevent the deterioration of the photo-resist formed on the surface of the object. If the adhesion is not strong, the object is not cooled sufficiently to suppress the deterioration of the photo-resist, because the etching rate drops when the temperature of the object drops.

Problems of conventional etching apparatus will be explained below. FIG. 11 is a sectional view of a parallel plate type dry etching apparatus of the cathode coupled type. There is a pair of parallel plate electrodes (including an anode 2 and a cathode 3) within a vacuum chamber 1. The anode 2 is grounded, and the cathode 3 is supplied with radio frequency power of 13.56 MHz through a matching box 4. The cathode includes a cooling path 5 to supply cooling water as a coolant, and the cathode is thereby cooled. Etching gases are introduced from a gas flow tube 6 into the vacuum chamber 1, and are exhausted through an exhaust 7. A substrate 8 is disposed on the cathode 3.

In this conventional etching apparatus, the cathode forms a part of the vacuum chamber. The coolant of normal temperature flows into the cathode. However, water vapor liquifies and congelation forms on surface of the cathode 3 and the cooling path 5 based on the temperature difference between the inner temperature of the vacuum chamber 1 and the temperature of the cathode 3. As a result, water drips inside the apparatus, and short circuits occur.

For instance, a matching box 4 connected to the cathode 3 for adjusting impedance of the electrodes and the electric power is provided in the conventional etching apparatus. The matching box is provided under the electrode supplied with the radio frequency power. The congelation causes an electrical short in the matching box. A rubber O-ring, etc., is used to vacuum-seal the cathode side. This is generally heat-resisting. However, the rubber O-ring has hardens with the drop of the temperature of the cathode, and leakage occurs. There are similar problems in other conventional etching apparatus.

Problems caused in the etching of polycrystalline silicon using the conventional etching apparatus will be explained below. FIG. 12 shows the potential distribution in a reactive ion etching apparatus. Reference numbers 3 and 2 of FIG. 12 are the cathode and anode of the dry etching apparatus, respectively. The highest electric potential into the discharge space in the vacuum chamber is the plasma potential 10 shown in FIG. 12. Electrons are stored on all surface contacted with the plasma, so that the electron transfer is very great in comparison with the ions. As a result, the electric potential becomes lower than the plasma potential 10.

A big drop of the cathode voltage occurs near the surface of the cathode 3 to maintain the discharge, but the difference of the potential reaches only the plasma potential 10 near the surface of the anode 2. Therefore, the cathode coupled type has a good etching direction to contribute to the ion assisted chemical reaction. The anode coupled type has a low ion bombardment energy. Thus, the etching direction is not as accurate as the cathode coupled type. As a result, an undercut or inversely tapered feature, as shown in FIG. 2 (c), is apt to occur. Accordingly, the cathode coupled type is better from the view point of working efficiency, and this types is more suitable as a future fine pattern forming method of the submicron order.

A selectivity of the over material to the under material is important in addition to the working shape. For example, in an etching process of the gate material of polycrystalline silicon, etc., when the thickness of the gate oxide film becomes 100Å or less, a very high selectivity is required. In the cathode coupled type, the surface is dissolved or activated independently of the character of the material, because the ion bombardment energy is large. As a result, the selectivity of the cathode coupled type is generally smaller than that of the anode coupled type.

There are problems in that the selectivity is good but the working efficiency is not good in the anode coupled type, and the working efficiency is good but the selectivity is not good in the cathode coupled type. When a regular MOS transistor is manufactured by the anode coupled type method, the working efficiency of the anode coupled type causes the scattering of the channel length. On other hand, in the cathode coupled type, etching does not stop on the gate oxide film and progresses to the under silicon substrate. This causes deterioration of the yield.

In recent years, an ECR (Electron Cyclotron Resonance) discharge method has been developed and applied to the etching of polycrystalline silicon. An selectivity of 30 or more is obtained, so that the ion energy is multiplier greatly. However, the working efficiency is lower than the cathode coupled type so that the ion energy is small, similar to the anode coupled type ion etching apparatus.

SUMMARY OF THE INVENTION

Accordingly, an object of the invention is to provide a method of dry etching and an apparatus for use with such method capable of producing a multi-layered structure having substantially a vertical etching wall and a high selectivity.

Briefly, in accordance with one aspect of the invention, there is provided a method of the dry etching that disposing an object having a first a film and second film thereon into a vacuum chamber, introducing an activated reactive gas, and cooling the object in the temperature or less being deposited a film including at least the first film material on the first film.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

The inventors have discovered relationships about the temperature dependence of the etching rates of polycrystalline silicon, etc., and the silicon oxide film using reactive gases including chlorine, etc. It was found that the etching rate varies linearly to the reciprocal of the temperature in polycrystalline silicon, etc. However, it was also found that there are two kinds of temperature dependence in a silicon oxide film. Namely, the inclination of the variation at the high temperature side is smaller than at the low temperature side. In other words, the selectivity improves remarkably at the low temperature side. Furthermore, it has been ascertained that other materials also have a high selectivity.

If the temperature of the surface of the substrate is high, etching products, e.g., $SiCl_4$ desorbed from the surface of the object by vaporization, etc., result in a reaction between the reactive gases and the object, e.g. polycrystalline silicon. Continuously, the surface of the object is activated and decomposed, and the ion assisted chemical reaction makes progress.

However, when the object is cooled to a below-zero temperature, etching products, e.g. $SiCl_4$, having low vapor pressure are hard to vaporize from the surface of the object. Namely, etching products cover the surface of the object, and protect the surface of the silicon oxide film from the ion bombardment. Therefore, the silicon oxide film is excited and decomposed together with etching products. Thus, the degree of desorption of the silicon oxide film is decreased.

When the under material of the object is silicon oxide, silicon is generated by decomposition of $SiCl_4$ and oxygen is generated by decomposition of $SiO_2$. Generated silicon and oxygen forms $SiO_2$ again. Therefore, the etching rate of $SiO_2$ falls greatly and the etching rate improves.

Furthermore, the chemical reaction using active species (radicals) having no charge generated from the decomposition of the reactive gas has a greater temperature dependence than the ion assisted chemical reaction. The under cutting becomes smaller, the lower the substrate temperature, and substantially vertical etching can be carried out.

The relation between the reciprocal of the substrate temperature and the etching rate when the second film formed on the first film is selectively etched, will be explained using FIG. 1. A silicon oxide film (A) and a silicon nitride film (B) were used as the first film, and phosphorous doped polycrystalline silicon (a), molybdenum silicide (b), tungsten silicide (c) and titanium silicide (d) were used alternatively as the second film.

Figure 11:
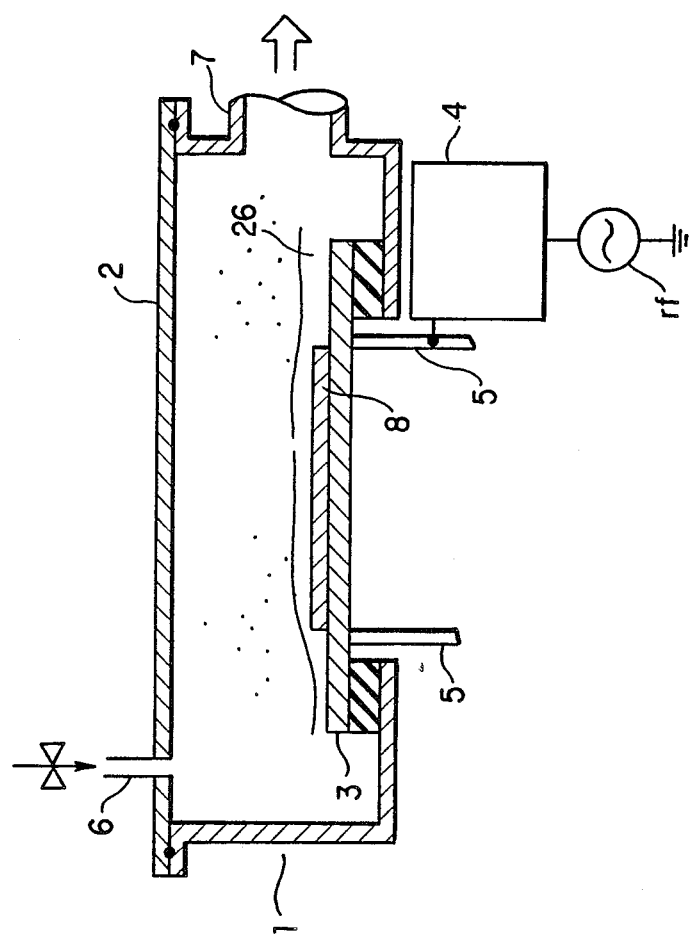
FIG. 11 illustrates partly in section an conventional apparatus.
Figure 12:
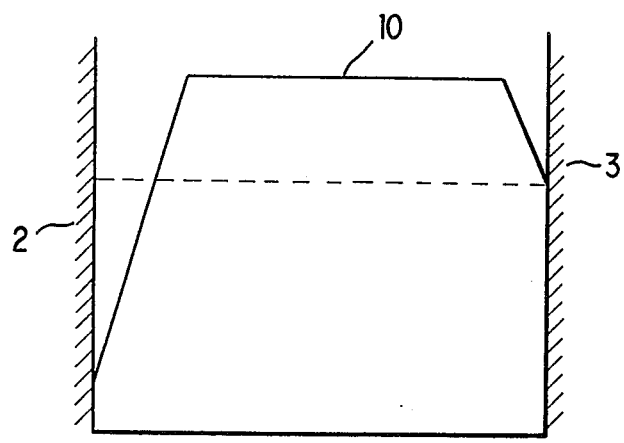
FIG. 12 is a graphical representation of the electric potential into the discharge space of the conventional apparatus.

The dry etching apparatus used to measure these characteristics was basically the same as the apparatus shown in FIG. 11, except for the cooling means, which could cool to a below-zero temperature. Chlorine gas was introduced into the vacuum chamber as the reactive gas, and the pressure was set 0.05 Torr. The output of the radio frequency power was 200 Watt.

Figure 1:
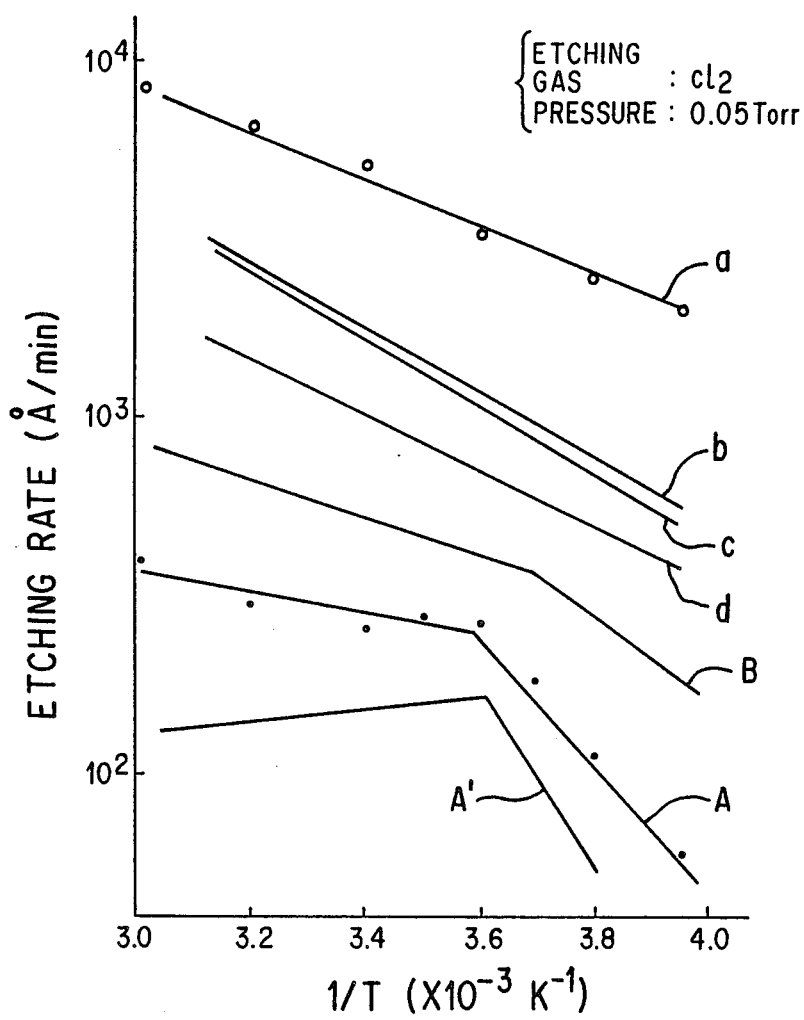
FIG. 1 is a graphical representation of the relation between the reciprocal of the temperature of a substrate and the etching rate.

In FIG. 1, the longitudinal axis represents the etching rate and the transverse axis represents the reciprocal of the temperature. The etching rate of the second film fell linearly with reduction of the temperature. The etching rate of the first film fell with the reduction of the temperature, but an inflection point was evident near 0° C. ($3.6 \times 10^{-3} K^{-1}$). The etching rate fell more rapidly below the temperature of the inflection point. As a result, the selectivity increased below the zero temperature point.

As a result of this phenomenon, the fall of the substrate temperature complicates the desorbing of etching products from the surface of the substrate, and reduces the vapor pressure. Thus, surface concentration becomes high. In this embodiment, the etching product is the $SiCl_4$ formed by the reaction between chlorine gas and polycrystalline silicon. When the first film is silicon oxide, the ion bombardment forms the silicon oxide again. This is because, oxygen reacts with etching products, including silicon. Namely, although silicon oxide is desorbed by the etching reaction from the surface of the substrate, silicon oxide is deposited again by the CVD reaction using gaseous phase etching products. As a result, the etching rate of the silicon oxide film falls remarkably and the selectivity is improved.

In the case of the silicon nitride film (B), a similar tendency to the silicon oxide film (A) was shown. The best mode selectivity was obtained when polycrystalline silicon (a) was etched selectively on silicon oxide (A). The invention can be used with other combinations, e.g., polycrystalline silicon (a) on silicon nitride (B) or silicon nitride (B) on silicon oxide (A). In the etching combination of silicon oxide and polycrystalline silicon, the most suitable cooling temperature was $-10°$ C.--$30°$ C.

The inflection point in the relation of the reciprocal of the temperature and the etching rate changes with the pressure. When the pressure is lower, the temperature of the inflection point is also lower. The inclination of the negative characteristic seldom becomes positive (line A' shown in FIG. 1). However, the inclination of the negative characteristic changes at the inflection point to a much steeper drop.

Figure 2A:
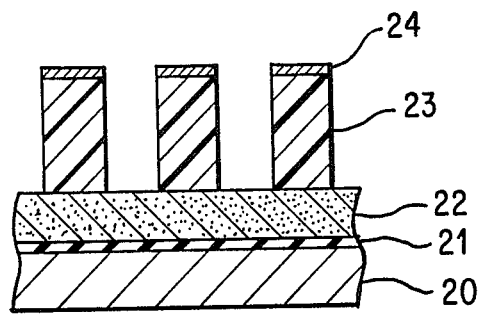
FIGS. 2 (a) to (c) are sectional views of objects to be etched using the invention and the conventional process.
Figure 2B:
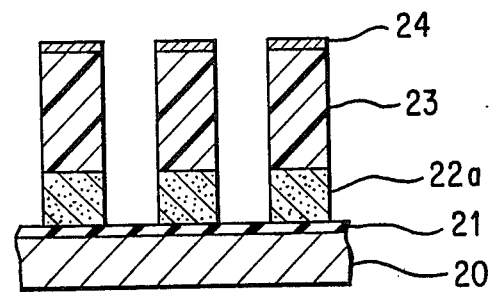
Figure 2C:
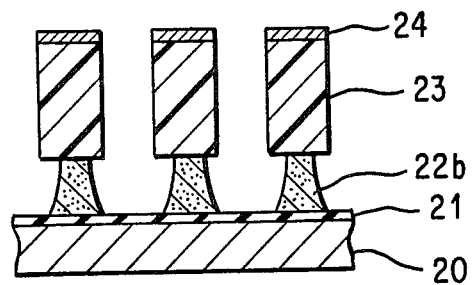

FIGS. 2 (a) to (c) show sectional views of objects etched in comparison with the invention and the conventional process. The object is comprised of a P-type silicon substrate (the crystal direction is 100) 20, a first film 21 of $SiO_2$ formed on the substrate 20 by a CVD process and a second film 22 of polycrystalline silicon formed on the first film 21. An under photo-resist film 23 and Spion glass as an intermediate film 24 are formed on the second film (shown in FIG. (a).

The polycrystalline silicon film 22a was etched vertically without the side etching when the substrate was cooled to $-20°$ C. (shown in FIG. 2(b)). The normal temperature etching for the comparison caused the side etching on the second film 22b (shown in FIG. 2(c)).

Essentially, the phosphorous doped polycrystalline silicon is apt to experience side etching from reacting naturally with the chlorine radical. However, in the reactive ion etching, decomposition products stick to the side wall of the polycrystalline silicon. The side wall is protected from the attack of the radical. The side etching is prevented and the vertical etching is carried out. Therefore, when a multi-layered photo-resist without the direct exposure of the plasma is used as a mask, a side wall protecting layer is not formed. As a result, the side etching generates at the normal temperature. However, the temperature dependence of the chemical reaction progressing naturally by the radical is more than the temperature dependence of the ion assisted chemical reaction. Moreover, the mobility of the radical is small on the etching surface at the low temperature. The side etching is not caused on the polycrystalline silicon at $-20°$ C. This invention is particularly useful in that case.

A similar effect is obtained not only in the etching cathode coupled type, but also the anode coupled type. In the anode coupled type etching apparatus, the difficult point is the working efficiency. However, the invention improved not only the selectivity, but also the working efficiency. With the invention, it is possible to obtain a high selectivity and improved the working efficiency.

Figure 3:
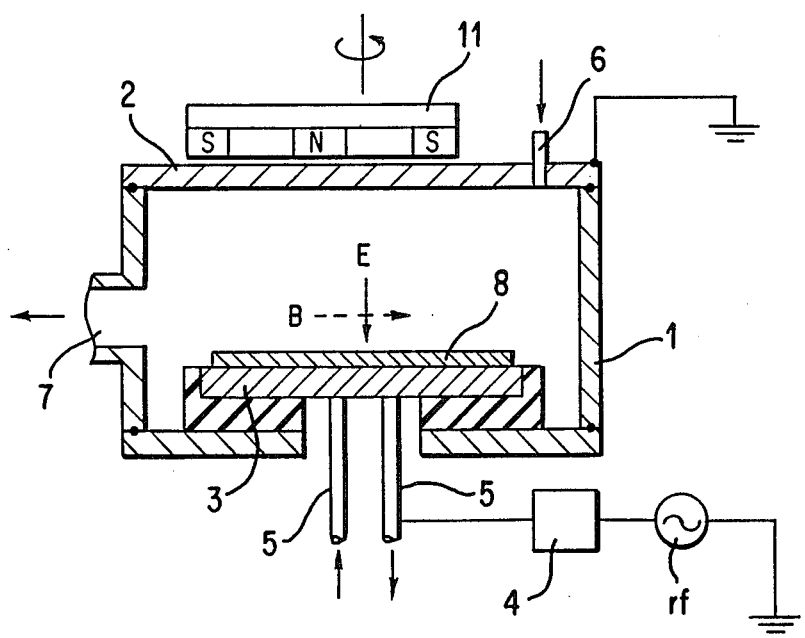
FIG. 3 illustrates partly in section an apparatus of an embodiment of the invention.

FIG. 3 shows an embodiment of a dry etching apparatus according to the invention. FIG. 3 is basically similar to FIG. 11, with the same parts described by the same reference. This embodiment has two additional features. First, the cooling means 5 cools to below the temperature near the inflection point. This increases the inclination of the negative characteristic in the reaction. Also, a magnetic field generating means 11 is provided into a vacuum chamber 1.

The magnetic field generating means 11 includes a magnet provided on an anode 2 and the magnet is rotatable eccentrically. Electrons perform cycloid movement in the crossed area at which applied magnetic field from the magnet to the cathode 3 and the direct current electric field E cross vertically. The high density magnetron plasma moves in the state of closing the surface of the substrate 8 with eccentric rotation of the magnet, and the high selectivity etching to the substrate is possible.

Figure 4:
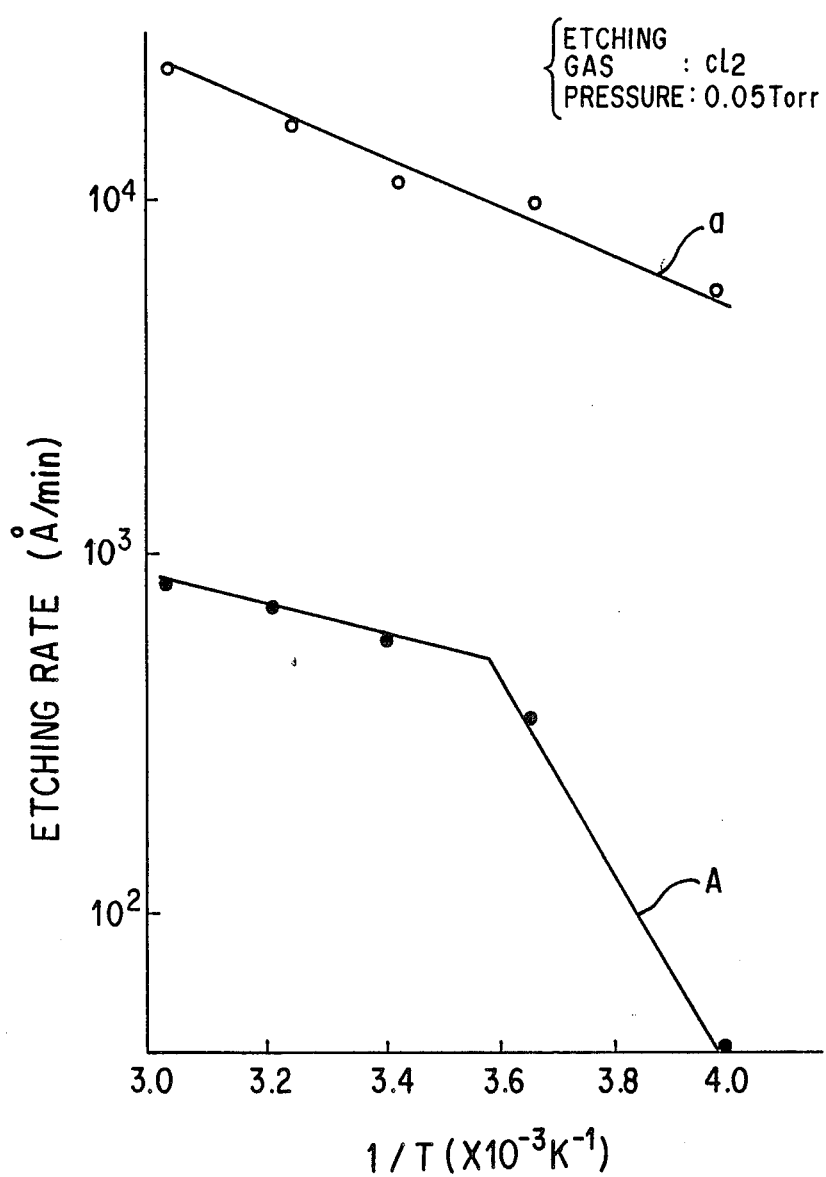
FIG. 4 is a graphical representation described the relation between the reciprocal of the temperature of a substrate and the etching rates of an embodiment of the invention.

FIG. 4 shows a graphical diagram describing the relation between the etching rate and the reciprocal of the temperature when the etching was performed introducing the chlorine gas into the vacuum chamber. The gas pressure is 0.05 Torr and the radio frequency power is 200 Watt. The phosphorous doped polycrystalline silicon film as the second layer is formed on the whole surface of the substrate 8 and the silicon oxide selectively patterned film as the first layer is formed on the second film. FIG. 4 describes a similar characteristic of the above-mentioned embodiment without the magnetic field, but this embodiment using a magnetic field can obtain a higher selectivity.

In this embodiment, silicon oxide was used as the first film and phosphorous doped polycrystalline silicon was used as the second film. The etching gas was chlorine gas. However, other materials and other halogen gases as useful.

Other embodiment of the invention will be explained following. This embodiment relates to the etching process divided two steps. The object to be etched having same structure shown in the FIG. 2 is etched by the normal relative ion etching first. The second film is formed the very thin film. Therefore, the object to be etched is etched with cooling. The etching progresses faster during the first step, so, it is useful particularly when the second film is very thicker than the first film.

Figure 5:
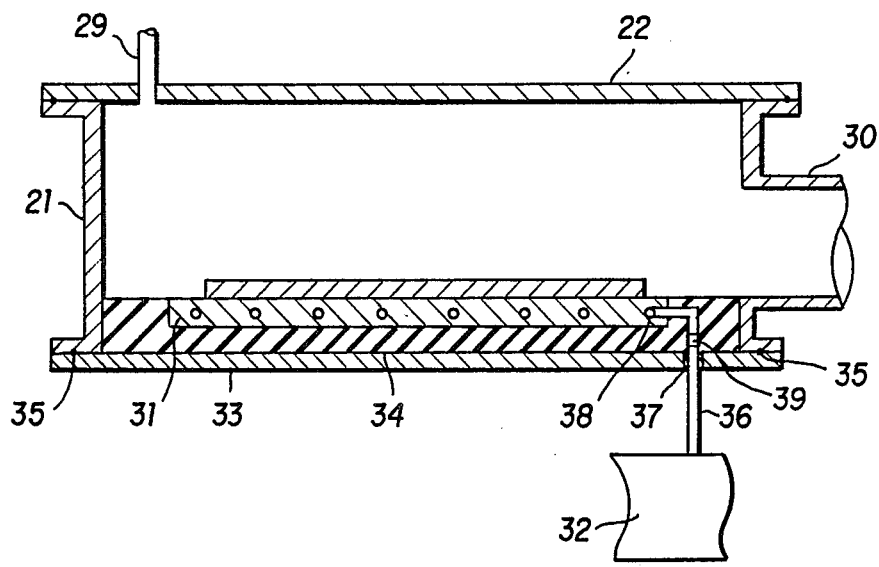
FIG. 5 illustrates partly in section an apparatus of other embodiment of the invention.

FIG. 5 describes another type of the etching apparatus of the invention. It is basically similar to the apparatus shown in FIG. 11. This apparatus is the cathode coupled type. A cathode 31 is not a part of the wall of the vacuum chamber, disposed on a bottom plate 33 composed the vacuum chamber through a insulator 34. The bottom plate 33 and the flange of the vacuum chamber is sealed airtightly by insulating elastic O-ring 35. An upper plate of the vacuum chamber is sealed airtightly using O-ring. A pipe flowed the coolant passes through the bottom plate outside of the vacuum chamber. The passed through portion of the pipe is made of ceramic pipe 36 to insulate the heat. The ceramic pipe 36 is fixed using a resin 37 to the bottom plate 33 and sealed airtightly.

A stainless steel pipe 38 is buried spirely inside of the cathode, because can be cooled usefully the object to be etched. The stainless steel pipe 38 and the ceramic pipe 36 are joined using a connector 39. The stainless steel pipe 38 and the connector 39 is welded, and the connector 39 and the ceramic pipe 36 are sealed using the O-ring. Thus, the coolant is flowed inside the cathode.

The coolant flows in the ceramic pipe 36 and the stainless steel pipe 38 through the temperature control means 32 being able to cool voluntarily below the temperature of the inflection point. In this temperature, the inclination of the negative characteristic shown the relationship between the reciprocal of the temperature and the etching rate becomes large in response to the material of the object 25 to be etched disposed on the cathode 31. Any coolants are acceptable if these have cooling capability for the object. This embodiment has used a liquid nitrogen. A flon gas is also useful. The cooling means can be used a water jacket type. These cooling system can cool the cathode to about $-30°$ C. Therefore, this apparatus can carry out to etch having the high selectivity.

The congelation is prevented by the insulator 34 provided inside the bottom plate 33, as a result, the electrical short disappeared. The hardening of the O-ring and the leakage have been prevented by the use of a silicon rubber in spite of the at $-30°$ C.

Figure 6:
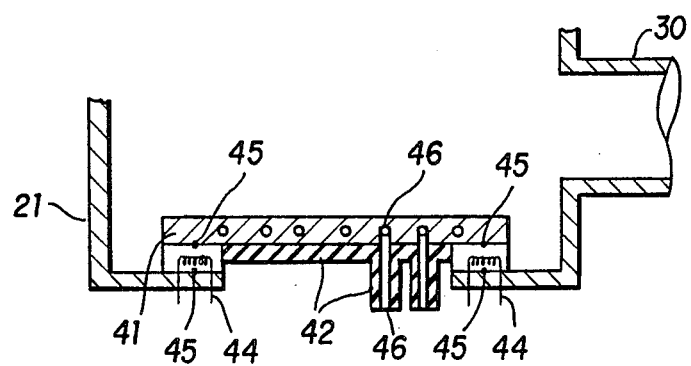
FIG. 6 illustrates partly in section an apparatus of other embodiment of the invention.

FIG. 6 shows another embodiment of the apparatus of the invention in which has another type of the congelation preventing means. This embodiment is similar to the above-mentioned embodiment shown in FIG. 5. A cooling pipe 45 flowed the coolant therein is provided into an cathode 41. The coolant can cool to the temperature which the inclination of the negative characteristic shown the relationship between the reciprocal of the temperature and the etching rate becomes large in response to the material of the object to be etched disposed on the cathode 41. The behind of the cathode 41 is covered by a thick heat insulating material 42. The vacuum sealing is carried out using the O-ring. However, a heater 44 is buried into the insulator 43 to keep the normal temperature and to prevent the hardening of the O-ring. FIG. 7 (a) shows a selectional view of a general cylindrical plasma etching apparatus of another embodiment of the invention. A gas introducing means 52, an exhaust 53 and a coil or a electrode (not shown) suppling a radio frequency power are provided surrounding a quartz cylindrical vacuum chamber 51. An etching gas is supplied by the gas flow tube 52, and the pressure of the etching gas is kept between 0.1–1 Torr. Furthermore, the etching gas is supplied the radio frequency power generated capacitively or inductively using the coils or electrodes. Thus, the plasma is generated in the chamber and an object 54 is etched.

The object 54 to be etched is generally disposed on a quartz boat 55 and is floated electricallly. As a result, the potential difference of the object is merely the difference of a plasma potential and a floating potential. The contribution of the ion assisted chemical reaction is small. The etching is mainly progressed by radicals. Therefore, the working shape of the object is isotropical.

Generally, the mixing gas composed of $CF_4$ and oxygen (including about 10%) is introduced, and is used to etch the polycrystalline silicon film and the nitride silicon film. In the conventional apparatus shown in FIG. 7(a), the high etching rate, e.g., about 20, is obtained between the phosphorous doped polycrystalline silicon film and the silicon oxide film, but the selectivity between the silicon nitride film and the silicon oxide film is small, e.g., about 5–6. The improvement of the selectivity is required to remove the silicon nitride in a LOCOS process.

Figure 7A:
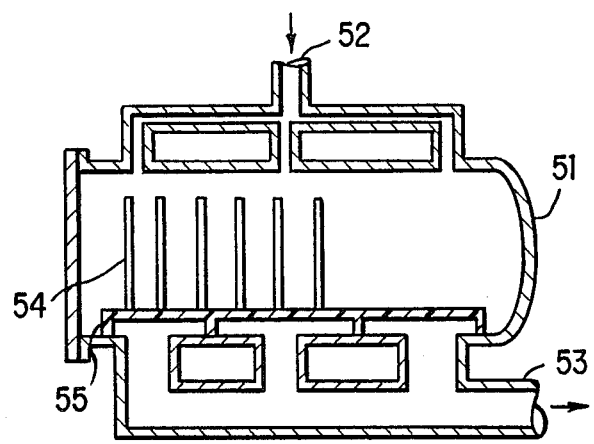
FIGS. 7 (a) and (b) illustrate partly in section apparatuses of other embodiments of the invention.
Figure 7B:
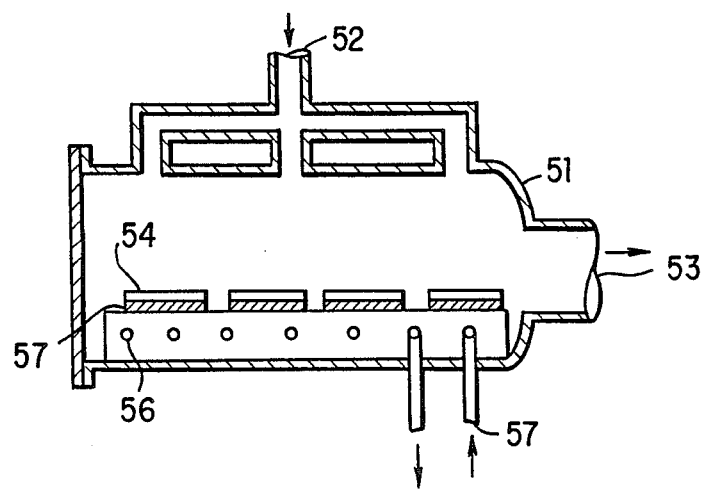

FIG. 7(b) shows an improved apparatus of other embodiment of the invention. This apparatus has an improved cooling means to cool an object 54. Different parts from the conventional apparatus shown in FIG. 7(a) are below. A printed board 57 is disposed on an object supporting holder 56, and the object 54 to be etched is chucked electrostatically. The object supporting holder 56 is cooled flowing the coolant in a cooling pipe 57.

In this embodiment, the object is cooled at $-20°$ C. which is the temperature or less of the inflection point changed the characteristic of the silicon oxide film similarly shown in FIG. 5. As a result, chlorine of about 30% is added in the mixing gas of $CF_4$ and oxygen, the selectivity between the polycrystalline film and the silicon oxide film becomes 30, and the selectivity between the silicon nitride film and the silicon oxide film is improved 12–15.

Figure 8:
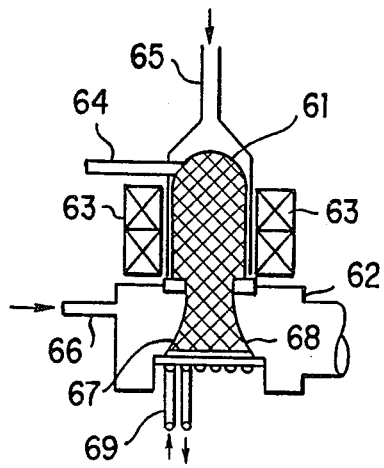
FIG. 8 illustrates partly in section apparatus of other embodiment of the invention.

FIG. 8 shows a ECR type dry etching apparatus of other embodiment of the invention. This apparatus is comprised of a discharge chamber 61 made of quartz and an etching chamber 62 separated from the discharge chamber 61. A magnet 63 generated the magnetic field of 875 gauss is provided surround the discharge chamber 61. A micro-wave is supplied in the discharge chamber 61 through a micro-wave introducing guide 64 from a micro-wave power source (not shown). An etching gas can be introduced in discharge and etching chambers pipe arrangements 65 and 66.

An object 67 to be etched is disposed on an object supporting holder 68 provided in the etching chamber 62. The object supporting holder has a cooling means 69 being able to cool to the temperature which the inclination of the negative characteristic shown the relationship between the reciprocal of the temperature and the etching rate becomes large in response to the material of the object. The cooling means 69 is connected to a temperature control means, and can cool voluntarily. The ion generated by the ECR discharge in the discharge chamber is pushed out along a slope of a magnetic field, and is bombarded about vertically on the object to be etched.

An operating pressure is low, e.g. $10^{-4}$ Torr. As a result, an amount of the radicals is few. This ECR etching apparatus is a kind of ion shower type etching apparatuses. A feature of this apparatus is that an ion energy is small because a plasma potential is low and the object 67 floates electrically. If the etching of phosphorous doped polycrystalline silicon is used the chlorine gas only, the remains causes. Therefore, a mixture of $SF_6$ and chlorine is used. This apparatus can obtain the etching ratio of about 40 to silicon oxide under the condition of being not caused remains even if without the cooling (chlorine is 80%, $SF_6$ 10%, whole gas volume of the flow is 15 SCCM, pressure is 0.0003 Torr and power of micro-wave is 200 Watt).

Figure 9A:
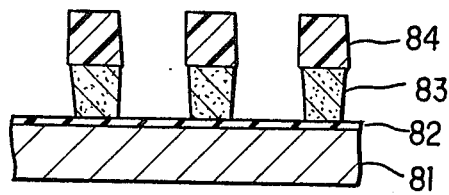
FIGS. 9 (a) and (b) are sectional views of objects to be etching using the conventional and the invention process.

A silicon oxide film 82 as a first film is formed on a substrate 81 and a phosphorous doped polycrystalline silicon film 83 as a second film is formed on a first film. A photoresist film 84 used a mask is covered selectively on the unnecessary parts of etching of the second film 83. The second film 83 of above-mentioned substrate is slightly side-etched (shown in FIG. 9(a)) or is apt to become the overhanging shape.

Figure 9B:
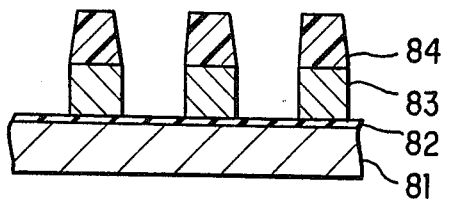

One side, when above-mentioned substrate was etched under the condition which the object temperature was −20° C. operating the cooling means 69, the selectivity improved more 50 and the working shape was very excellent without the side-etching and the over hanging (shown in FIG. 9(b)).

An ion beam etching apparatus is known, resembling above-mentioned ECR type etching apparatus, which is devided a discharging part and a etching part. A positive ion is taken out from a plasma by the supplying the negative potential on a grid. The positive ion is accelerated and bombarded on the object to be etched. An electron beam etching apparatus is also known. In this apparatus, negative ion and electron are taken out by the suppling the positive potential on the grid, and these are bombarded on the substrate. These above-mentioned apparatuses can give similar effects if a reactive gas including a chlorine gas is used and the substrate is cooled.

Figure 10:
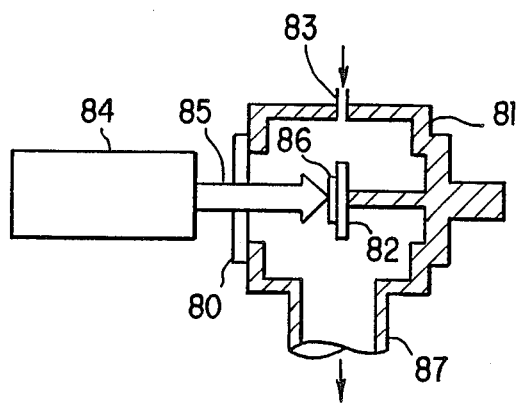
FIG. 10 illustrates partly in section an apparatus of other embodiment of the invention.

FIG. 10 shows a photo-activating etching of other embodiment of the invention. An object holder 82 being able to cool the object is provided in a vacuum chamber 81 having a quartz window 80 introducing ultraviolet rays. An etching gas is introduced in the vacuum chamber from a gas introducing nozzle 83, and emitted ultraviolet rays 85 from an ultraviolet rays source 84 to an object 86. The gas is exhausted from an exhaust 67. In this apparatus, a chlorine gas and a fluorine gas are introduced in the vacuum chamber, and kept the pressure of several ten Torr. These gases are emitted the ultraviolet rays, and separate chlorine. The etching of a polycrystalline is carried out to etch using chlorine radicals.

A photo-activating etching does not damage different the etching using the plasma. However, in the normal temperature etching, phosphorous doped polycryatalline silicon reacts naturally to chlorine radicals. As a result, the side etching caused and the straight working was difficult. Thus, the etching carried out to the object beeing cooled to −20° C. by the cooling means, and emitted an eximer laser (XeCl) as the violet lays to the chlorine gas including fluorine. The side etching has been prevented and the straight etching has been carried out. It is considered that the etching rate of radicals drops by the cooling but parts only irradiated by rays increase the temperature, and the reaction is accelerated by light.

Eximer laser (XeCl rays, $XeCl_4$ is 303 nm) was used as the violet rays source, but anything lights having the wave length to be separated the chlorine gas, e.g., a low pressure Hg lump and the Hg-Xe lump etc. Furthermore, the cooling the substrate is useful in other photo-activating etching using a vacuum violet rays of shorter wave length or SOR (Syncrotron Orbital Resonance) rays.

What is claimed is:

1. A method of dry etching, comprising the steps of: disposing an object to be etched in a vacuum chamber, the object having a first film thereon and a second film over the first film; introducing an activated reactive gas into the chamber for selectively etching the second film; and cooling the object to a temperature at which a thin film including at least an element of the first film deposits on the first film selectively.

2. The method of claim 1 wherein the step of disposing includes the step of forming the first film of a material having two different etching rate characteristics which varies with respect to variations in temperature over a specified range.

3. The method of claim 1 wherein the step of introducing includes the step of simultanuously exposing the gas to a magnetic field.

4. The method of claim 1, wherein the cooling temperature is the temperature or less being near an inflection point changed the inclination of the negative characteristic of the relation of the etching rate to the reciprocal of the temperature of the object.

5. The method of claim 1, wherein the reactive gas includes at least one of halogenous gases.

6. The method of claim 3, wherein the reactive gas includes at least one of halogenous gases.

7. The method of claim 1, wherein the second film is polycrystalline silicon and the first film is silicon oxide.

8. The method of claim 1, wherein the second film is polycrystalline silicon and the first film is silicon nitride.

9. The method of claim 1, wherein the second film is phosphorous doped polycrystalline silicon and the first film is silicon oxide.

10. The method of claim 1, wherein the second film is phosphorous doped polycrystalline silicon and the first film is silicon nitride.

11. The method of claim 1, wherein the second film is silicon nitride and the first film is silicon oxide.

12. The method of claim 1, wherein the second film is tungsten and the first film is silicon oxide.

13. The method of claim 1, wherein the second film is tungsten and the first film is silicon nitride.

14. The method of claim 1, wherein the second film is molybdenum and the first film is silicon oxide.

15. The method of claim 1, wherein the second film is molybdenum and the first film is silicon nitride.

16. The method of claim 1, wherein the second film is titanium and the first film is silicon oxide.

17. The method of claim 1, wherein the second film is titanium and the first film is silicon nitride.

18. The method of claim 1, wherein the second film is tungsten silicide and the first film is silicon oxide.

19. The method of claim 1, wherein the second film is tungsten silicide and the first film is silicon nitride.

20. The method of claim 1, wherein the second film is molybdenum silicide and the first film is silicon oxide.

21. The method of claim 1, wherein the second film is molybdenum silicide and the first film is silicon nitride.

22. The method of claim 1, wherein the second film is titanium silicide and first film is silicon oxide.

23. The method of claim 1, wherein the second film is titanium silicide and first film is silicon nitride.

24. The method of claim 1, wherein the second film is impurity doped polycrystalline silicon and the first film is silicon oxide.

25. The method of claim 24, wherein reactive gas is chlorine and the cooling temperature is 0° C. or less.

26. The method of claim 1, wherein the pressure of the reactive gas is $10^{-4}$ Torr or more.

27. The method of claim 1, wherein the object is disposed in the separated portion from the activated portion of the reactive gas.

28. The method of claim 1, wherein the reactive gas is activated by ultraviolet rays.

29. The method of claim 1, wherein the reactive gas is activated by SOR rays.

30. The dry etching apparatus for eching an object having first and second films successively formed thereon by a reactive gas, comprising;
 a vacuum chamber, including means for supporting the object therein;
 means for introducing the reactive gas into the chamber;
 means for activating the gas for selectivity etching the second film;
 means for cooling the object to a temperature at which a thin film including at least an element of the first element deposits on the first film.

31. The apparatus of claim 30, wherein the means for supporting the object includes means for flowing a coolant to cool the object.

32. The apparatus of claim 30, wherein the cooling means includes means for preventing the congelation.

33. The apparatus of claim 32, wherein the preventing means includes a heat insulating material covering the cooling means.

34. The apparatus of claim 30, wherein the cooling means includes means to cool the object to 0° C. or less.